US008996970B2

(12) United States Patent
Zhang et al.

(10) Patent No.: US 8,996,970 B2
(45) Date of Patent: Mar. 31, 2015

(54) SYSTEMS AND METHODS FOR POSITIVE FEEDBACK SHORT MEDIA DEFECT DETECTION (71) Applicant: LSI Corporation, Milpitas, CA (US)

(72) Inventors: Fan Zhang, Milpitas, CA (US); Weijun Tan, Longmont, CO (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 52 days.

(21) Appl. No.: 13/659,795

(22) Filed: Oct. 24, 2012

(65) Prior Publication Data

US 2014/0115431 A1    Apr. 24, 2014

(51) Int. Cl.
*G06F 11/00* (2006.01)
*G06F 11/08* (2006.01)
*H03M 13/29* (2006.01)
*H03M 13/37* (2006.01)
*H03M 13/00* (2006.01)
*H03M 13/11* (2006.01)
*H03M 13/41* (2006.01)

(52) U.S. Cl.
CPC .......... *G06F 11/08* (2013.01); *H03M 13/1111* (2013.01); *H03M 13/2957* (2013.01); *H03M 13/3723* (2013.01); *H03M 13/4138* (2013.01); *H03M 13/6337* (2013.01); *H03M 13/6343* (2013.01); *H03M 13/658* (2013.01)
USPC ....................................................... 714/799

(58) Field of Classification Search
CPC .... H04L 1/0061; H05K 999/99; G06F 11/10; G06F 11/1008; G06F 11/1076

USPC .......................................................... 714/799
See application file for complete search history.

(56) References Cited

U.S. PATENT DOCUMENTS

| | | | |
|---|---|---|---|
| 5,802,069 | A | 9/1998 | Coulson |
| 6,065,149 | A | 5/2000 | Yamanaka |
| 6,301,679 | B1 | 10/2001 | Tan |
| 6,446,236 | B1 | 9/2002 | McEwen et al. |
| 6,557,113 | B1 | 4/2003 | Wallentine et al. |
| 6,691,263 | B2 | 2/2004 | Vasic et al. |
| 6,697,977 | B2 | 2/2004 | Ozaki |
| 6,731,442 | B2 | 5/2004 | Jin et al. |
| 6,738,948 | B2 | 5/2004 | Buckley et al. |
| 6,980,382 | B2 | 12/2005 | Hirano et al. |
| 7,154,936 | B2 | 12/2006 | Bjerke et al. |
| 7,168,030 | B2 | 1/2007 | Ariyoshi |
| 7,173,784 | B2 | 2/2007 | Cideciyan et al. |
| 7,203,015 | B2 | 4/2007 | Sakai et al. |

(Continued)

FOREIGN PATENT DOCUMENTS

| | | |
|---|---|---|
| EP | 0549151 | 6/1993 |
| EP | 1096491 | 10/2005 |

(Continued)

OTHER PUBLICATIONS

Bagul, Y.,G.: "Assessment of current health and remaining useful life of hard disk drives" [online] Jan. 1, 2009 [retrieved on Oct. 14, 2010] Retrieved from the internet:<URL;htt.

(Continued)

*Primary Examiner* — Albert Decady
*Assistant Examiner* — Enam Ahmed
(74) *Attorney, Agent, or Firm* — Hamilton DeSanctis & Cha (57) ABSTRACT

Various systems and methods for media defect detection.

20 Claims, 4 Drawing Sheets

(56) References Cited

U.S. PATENT DOCUMENTS

| | | |
|---|---|---|
| 7,237,173 B2 | 6/2007 | Morita et al. |
| 7,254,192 B2 | 8/2007 | Onggosanusi |
| 7,257,172 B2 | 8/2007 | Okamoto et al. |
| 7,359,313 B2 | 4/2008 | Chan et al. |
| 7,441,174 B2 | 10/2008 | Li et al. |
| 7,457,212 B2 | 11/2008 | Oh |
| 7,652,966 B2 | 1/2010 | Kadokawa |
| 7,688,915 B2 | 3/2010 | Tanrikulu et al. |
| 7,702,973 B2 | 4/2010 | Mead |
| 7,849,385 B2 | 12/2010 | Tan |
| 7,852,722 B2 | 12/2010 | Kikugawa et al. |
| 7,924,518 B2 | 4/2011 | Mathew |
| 7,952,824 B2 | 5/2011 | Dziak |
| 8,095,855 B2 | 1/2012 | Tan |
| 8,121,224 B2 | 2/2012 | Tan |
| 8,139,457 B2 | 3/2012 | Cao |
| 8,149,527 B2 | 4/2012 | Tan |
| 8,161,357 B2 | 4/2012 | Tan |
| 8,176,400 B2 | 5/2012 | Tan |
| 8,190,831 B2 | 5/2012 | Lee et al. |
| 8,201,051 B2 | 6/2012 | Tan |
| 8,219,892 B2 | 7/2012 | Tan |
| 8,418,019 B2 * | 4/2013 | Ivkovic et al. ............ 714/752 |
| 2002/0041459 A1 | 4/2002 | Singer |
| 2003/0043487 A1 | 3/2003 | Morita et al. |
| 2003/0063405 A1 | 4/2003 | Jin et al. |
| 2003/0066020 A1 | 4/2003 | Morita |
| 2003/0147172 A1 | 8/2003 | Singer et al. |
| 2003/0172325 A1 * | 9/2003 | Wyatt et al. ............... 714/53 |
| 2007/0061687 A1 | 3/2007 | Hwang |
| 2009/0235116 A1 | 9/2009 | Tan |
| 2009/0235146 A1 | 9/2009 | Tan |
| 2009/0271670 A1 | 10/2009 | Tan |
| 2010/0042877 A1 | 2/2010 | Tan |
| 2010/0050046 A1 * | 2/2010 | Chen et al. ............... 714/752 |
| 2010/0229031 A1 | 9/2010 | Tan |
| 2010/0268996 A1 | 10/2010 | Yang |
| 2010/0269023 A1 | 10/2010 | Yang |
| 2011/0205653 A1 | 8/2011 | Mathew |
| 2011/0209026 A1 | 8/2011 | Xia |
| 2012/0047396 A1 * | 2/2012 | Garani et al. ............ 714/6.12 |
| 2012/0087033 A1 | 4/2012 | Yang |
| 2012/0254679 A1 | 10/2012 | Tan |
| 2012/0266055 A1 | 10/2012 | Zhang |
| 2015/0006981 A1 * | 1/2015 | Kou et al. ............... 714/703 |

FOREIGN PATENT DOCUMENTS

| | | |
|---|---|---|
| JP | 10-145243 | 5/1998 |
| JP | 2001-176213 | 6/2001 |
| JP | 2003-515861 | 5/2003 |
| JP | 2007-087529 | 4/2007 |
| WO | WO 01/39188 | 5/2001 |

OTHER PUBLICATIONS

Cruz J R et al "Erasure Detection Algorithms for Magnetic Recording Channels" IEEE Transactions on Magnetices vol. 40 No. 4, Jul. 1, 2004.

Cruz J R et al "Detection of Media Defects in Perpendicular Magnetic Recording Channels" IEEE Transactions on Magnetics vo. 41, No. 10 Oct. 1, 2005.

ECMA: Standardizing Information and Communication Systems: "Standard ECMA-272: 120 mm DVD Rewritable Disk (DVD-RAM)" Standard ECMA, No. 272, Feb. 1, 1998 pp. 43-51.

Galbraith et al, "Iterative Detection Read Channel Technology in Hard Disk Drives" [online] Oct. 1, 2008 Ret. from Internet: <URL:http://www.hitachigst.com.

Kavcic et al., "A Signal-Dependent Autoregressive Channel Model", IEEE Transactions on Magnetics, vol. 35, No. 5, Sep. 1999 pp. 2316-2318.

Mathew et al "Thermal Asperity Suppression in Perpendicular Recording Channels" IEEE Transactions on Magnetics vol. 41 No. 10, Oct. 1, 2005.

Nakamura, et al. "Performance Evaluation of LDPC Coding and Iterative Decoding System Using Burst Information" Jrnl of Institute of elec. Infrom, and Communication Eng. May 2007.

Sarigoz et al "Dropout-Tolerant Read Channels" IEEE Journal on Selected Areas in Communication, Apr. 2001 vol. 19, p. 744-755.

U.S. Appl. No. 13/558,228, filed Jul. 25, 2012, Weijun Tan, Unpublished.

U.S. Appl. No. 13/368,599, filed Feb. 8, 2012, Yang Cao, Unpublished.

U.S. Appl. No. 13/213,789, filed Aug. 19, 2011, Ming Jin, Unpublished.

U.S. Appl. No. 13/452,722, filed Apr. 20, 2012, Shaohua Yang, Unpublished.

U.S. Appl. No. 13/459,289, filed Apr. 30, 2012, Fan Zhang, Unpublished.

U.S. Appl. No. 13/547,516, filed Jul. 12, 2012, Jefferson E. Singleton, Unpublished.

U.S. Appl. No. 13/654,706, filed Oct. 18, 2012, Wu Chang, Unpublished.

U.S. Appl. No. 13/551,523, filed Jul. 17, 2012, Ming Jin, Unpublished.

U.S. Appl. No. 13/561,243, filed Jul. 30, 2012, Fan Zhang, Unpublished.

U.S. Appl. No. 13/652,046, filed Oct. 15, 2012, Ming Jin, Unpublished.

U.S. Appl. No. 13/525,194, filed Jun. 15, 2012, Bruce Wilson, Unpublished.

* cited by examiner

SYSTEMS AND METHODS FOR POSITIVE FEEDBACK SHORT MEDIA DEFECT DETECTION

BACKGROUND

Embodiments are related to systems and methods for transferring information, and more particularly to systems and methods for determining problems related to a medium associated with a data transfer.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any defects associated with the transfer medium. In some cases, data loss caused by defects in the transfer medium can make recovery of data from the transfer medium difficult even for data received from non-defective areas or times. Various approaches have been developed for identifying defects in the transfer medium. Such approaches provide a general ability to identify defects, but in many cases are inaccurate. In the best case, this inaccuracy limits the effectiveness of any defect identification. In the worst case, inaccurate defect detection may actually hamper the data recovery process.

Hence, for at least the aforementioned reasons, there exists a need in the art for advanced systems and methods for defect detection.

BRIEF SUMMARY

Embodiments are related to systems and methods for transferring information, and more particularly to systems and methods for determining problems related to a medium associated with a data transfer.

Various embodiments of the present invention provide data processing systems that include: a data detector circuit, a data decoder circuit, a media defect detector circuit, and a threshold detection circuit. The data detector circuit is operable to apply a data detection algorithm to a detector input to yield a first detected output, and to apply the data detection algorithm to the detector input to yield a second detected output. The data decoder circuit is operable to apply a data decoding algorithm to a first decoder input derived from the first detected output to yield a first decoded output, and to apply the data decoding algorithm to a second decoder input derived from the second detected output to yield a second decoded output. The media defect detector circuit is operable to generate a defect value based on a combination of the first detected output and the first decoded output, and to compare the defect value with a first defect threshold to yield a defect indicator for a region of a medium from which the detector input is derived for the first global iteration. The threshold selection circuit is operable to select a second defect threshold based at least in part on the defect indicator indicating a media defect for the first global iteration.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Embodiments are related to systems and methods for transferring information, and more particularly to systems and methods for determining problems related to a medium associated with a data transfer.

Various embodiments of the present invention provide data processing circuitry that include a data detection circuit operable to apply a data detection algorithm to a data input to yield a detected output, and a data decoding circuit operable to apply a data decoding algorithm to a decoder input derived from the detected output to yield a decoded output. As used herein, application of both the data detection algorithm and the data decoding algorithm is referred to as a "global iteration". In some cases, the data decoding algorithm may be repeatedly applied during a give global iteration. Each application of the data decoding algorithm during a given global iteration is referred to herein as a "local iteration".

As part of processing a data set, a media defect detection is applied. This media defect detection includes generated a value indicative of a media defect and comparing the value against a threshold. Where a either a first global iteration is being applied or a preceding global iteration did not indicate a media defect, the threshold is a default threshold. Alternatively, where a previous global iteration resulted in an indication of a media defect, a modified threshold is used. The modified threshold may be set such that a media defect is more easily identified. In one or more cases, the modified threshold is a value based upon threshold values for a preceding bit periods.

Various embodiments of the present invention provide data processing systems that include: a data detector circuit, a data decoder circuit, a media defect detector circuit, and a threshold detection circuit. The data detector circuit is operable to apply a data detection algorithm to a detector input to yield a first detected output, and to apply the data detection algorithm to the detector input to yield a second detected output. The data decoder circuit is operable to apply a data decoding algorithm to a first decoder input derived from the first detected output to yield a first decoded output, and to apply the data decoding algorithm to a second decoder input derived from the second detected output to yield a second decoded output. The media defect detector circuit is operable to generate a defect value based on a combination of the first detected output and the first decoded output, and to compare the defect value with a first defect threshold to yield a defect indicator for a region of a medium from which the detector input is derived for the first global iteration. The threshold selection circuit is operable to select a second defect threshold based at least in part on the defect indicator indicating a media defect for the first global iteration.

In some cases, the systems are implemented as an integrated circuit. In various cases, the systems are implemented as part of a storage device. In some such cases, the medium is a magnetic storage medium. In one or more cases, the data decoder circuit is a low density parity check decoder circuit. In particular cases, the data detector circuit may be a Viterbi algorithm data detector circuit, while in other cases the data detector circuit may be a maximum a posteriori data detector circuit.

In some instances of the aforementioned embodiments, the second defect threshold is selected to be the first defect threshold. In one or more instances of the aforementioned embodiments, the second defect threshold is selected to be the first defect threshold multiplied by a scalar value when the defect indicator indicates a media defect for the first global iteration. The scalar value is greater than unity. In some cases, the scalar value is programmable.

In one or more instances of the aforementioned embodiments, the defect value is a number of mismatches between the first detected output and the first decoded output within a first range of an instant location. The second defect threshold is selected as one the first defect threshold, or a number of mismatches between the first detected output and the first decoded output within a second range of the instant location. In some such instances, the number of mismatches between the first detected output and the first decoded output within a second range of the instant location is selected as the second defect threshold when the defect indicator indicates a media defect for the first global iteration.

In various instances of the aforementioned embodiments, the defect indicator is a first defect indicator and the defect value is a first defect value. In such instances, the media defect detector circuit is further operable to generate a second defect value based on a combination of the second detected output and the second decoded output, and to compare the second defect value with the second defect threshold to yield a second defect indicator for a region of a medium from which the detector input is derived for the second global iteration.

Other embodiments provide methods for media defect detection that include: applying a data detection algorithm to a detector input by a data detector circuit to yield a first detected output; applying a data decoding algorithm to a first decoder input derived from the first detected output to yield a first decoded output; applying a media defect detection algorithm to a combination of the first detected output and the first decoded output to yield a defect value; comparing the defect value with a first defect threshold to yield a defect indicator for a region of a medium from which the detector input is derived for a first global iteration; applying the data detection algorithm to the detector input to yield a second detected output; applying the data decoding algorithm to a second decoder input derived from the second detected output to yield a second decoded output; and selecting a second a second defect threshold based at least in part on the defect indicator indicating a media defect for the first global iteration.

Figure 1:
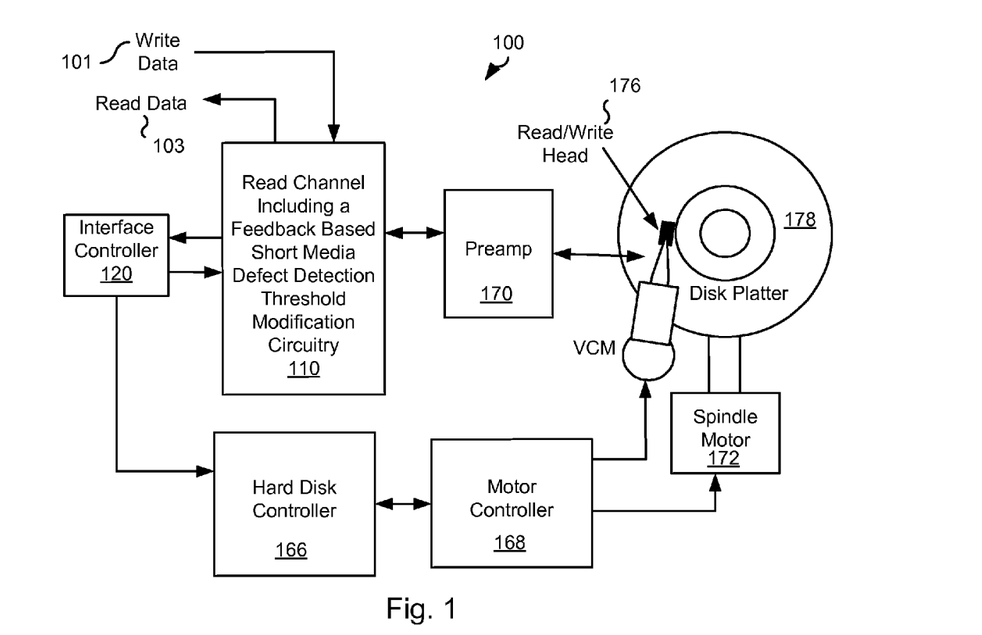
FIG. 1 shows a storage system including a read channel with feedback based short media defect detection threshold modification circuitry in accordance with various embodiments of the present invention.

Turning to FIG. 1, a storage system 100 including a read channel circuit 110 having feedback based short media defect detection threshold modification circuitry in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103.

As part of processing data accessed from disk platter 178, read channel circuit 110 performs a media defect detection process operable to determine whether received data is associated with a defective region of disk platter 178. This media defect detection includes selectively modifying a defect threshold based at least in part on whether a defect from the corresponding region was detected during a previous global iteration. In some embodiments of the present invention, the data processing circuit including the feedback based short media defect detection threshold modification circuitry may be implemented similar to that discussed below in relation to FIG. 2 or FIG. 4, and/or may apply data processing similar to that discussed below in relation to FIG. 3 or FIG. 5.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platter 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
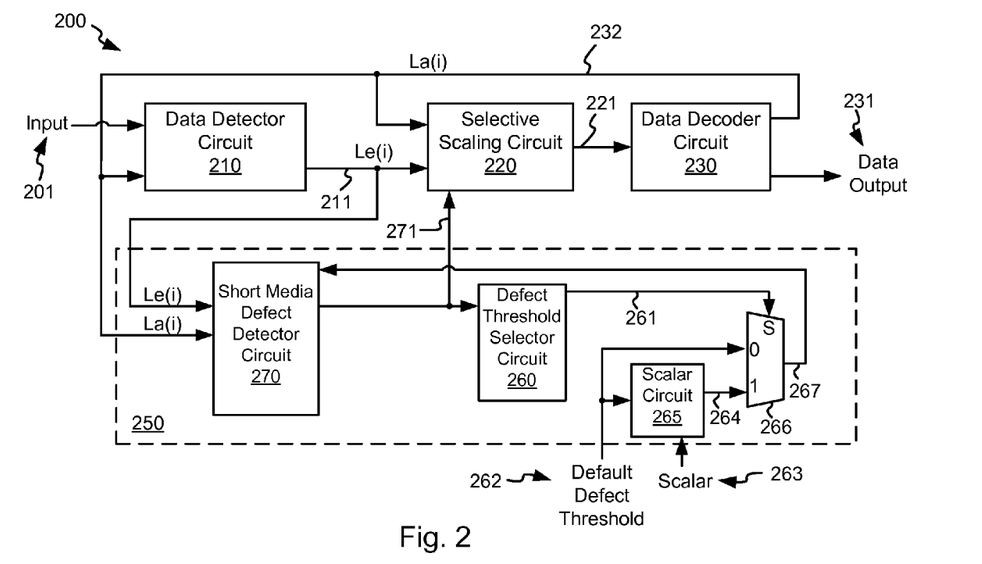
FIG. 2 depicts a data processing circuit including a feedback based short media defect detection threshold modification circuit in accordance with various embodiments of the present invention.

Turning to FIG. 2, a data processing circuit 200 including a feedback based short media defect detection threshold modification circuit 250 is depicted in accordance with various embodiments of the present invention. Feedback based short media defect detection threshold modification circuit 250 includes a short media defect detector circuit 270, a defect threshold selector circuit 260, a multiplexer circuit 266, and a scalar circuit 265. Data processing circuit 200 includes a data detector circuit 210 that applies a data detection algorithm to a data input 201 guided by a soft decoded output 232. Soft decoded output 232 is denoted La(i), where 'i' represents the iteration number. In particular, 'i' indicates data derived from the most recent iteration, and 'i−1' indicates data derived from a preceding iteration.

In some embodiments of the present invention, data input 201 is derived from a storage medium. Based upon the disclosure provided herein, one of ordinary skill in the art will recognize a variety of sources for data input 201. Data detector circuit 210 may be, but is not limited to, a maximum a posteriori data detector circuit, or a Viterbi algorithm data detector circuit. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Application of the data detection algorithm by data detector circuit 210 yields a detected output 211. Detected output 211 is denoted Le(i), where 'i' represents the iteration number. In particular, 'i' indicates data derived from the most recent iteration, and 'i−1' indicates data derived from a preceding iteration. An iteration denoted by 'i' is a global iteration which is defined as processing a data set through both data detector circuit 210 and a data decoder circuit 230.

Detected output 211 and soft decoded output 232 are provided to both a selective scaling circuit 220, and short media defect detector circuit 270 that performs a short media defect detection. Short media defect detector circuit 270 may be any circuit operable to generate a defect value (i) based upon a combination of detected output 211 and soft decoded output 232, where the defect value (i) corresponds to a likelihood of a media defect on a storage medium from which data input 201 is derived. Short media defect detector circuit 270 compares the generated defect value (i) with a defect threshold 267. Where the generated defect value (i) is greater than defect threshold 267, a defect indicator 271 is asserted. Otherwise, defect indicator 271 is not asserted. In some embodiments of the present invention, the defect value (i) is a number of consecutive, preceding instances of detected output 211 and soft decoded output 232 that do not match. In one particular embodiment of the present invention, short media defect detector circuit 270 may be implemented similar to that disclosed in U.S. Pat. No. 8,201,051 entitled "Method for Detecting Short Burst Errors in LDPC System", issued Jun. 12, 2012 to Tan et al. The entirety of the aforementioned reference is incorporated herein by reference for all purposes.

Defect threshold 267 is adjusted based upon whether defect indicator 271 was asserted to indicate a defect was found during a preceding global iteration processing the corresponding instance i. In particular, defect indicator 271 is provided to defect threshold selector circuit 260. Where defect indicator 271 is asserted indicating the occurrence of a defect at the location corresponding to the index i for the preceding global iteration, defect threshold selector circuit 260 asserts a selector output 261 to a multiplexer circuit 266 such that a scaled value 264 is selected as defect threshold 267. Scaled value 264 is a default defect threshold 262 multiplied by a scalar value 263 that is greater than unity (i.e., scalar value >1). Otherwise, where defect indicator 271 is de-asserted indicating the no occurrence of a defect at the location corresponding to the index i for the preceding global iteration, default defect threshold 262 is selected by multiplexer circuit 266 as defect threshold 267. In some embodiments of the present invention, scalar value 263 and default defect threshold 262 are programmable. In other embodiments of the present invention, one or both of scalar value 263 and default defect threshold 262 are fixed. In one particular embodiment of the present invention, scaled value 264 is a user programmable input or a fixed value in which case scalar circuit 265 can be eliminated.

The following pseudocode represents the operation of feedback based short media defect detection threshold modification circuit 250:

```
If(global iterations == 0) { //first global iteration
    for (i= 0 to end of data set){ // for each instance in the processing data set
        apply short media defect detection algorithm to yield a defect value (i);
        If (defect value (i) > default defect threshold){
            defect indicator (i) for the global iteration = asserted
        }
        Else {
            defect indicator (i) for the global iteration =de- asserted
        }
    }
}
Else If (global iterations > 0) {
    for (i= 0 to end of data set){ // for each instance in the processing data set
        apply short media defect detection algorithm to yield a defect value (i);
        If (defect indicator (i) == asserted for the prior global iteration){
            If (defect value (i) > scaled value){
                defect indicator (i) for the global iteration = asserted
            }
            Else {
                defect indicator (i) for the global iteration = de-asserted
            }
        Else If (defect indicator (i) == de-asserted for the prior global iteration){
            If (defect value (i) > default defect threshold){
                defect indicator (i) for the global iteration = asserted
            }
            Else {
                defect indicator (i) for the global iteration = de-asserted
            }
        }
    }
}
```

Defect indicator 271 is provided to a selective scaling circuit 220. Selective scaling circuit 220 delays detected output 211 to align it with defect indicator 271. Where defect indicator 271 is asserted, selective scaling circuit 220 applies a symbol by symbol scaling to each symbol in soft decoded output 232 that corresponds to defect indicator 271 and provides the scaled values as a scaled output 221, and passes detected output 211 through without scaling as scaled output 221 on a symbol by symbol basis where defect indicator 271 is not asserted. In another embodiment of the present invention, where defect indicator 271 is asserted, selective scaling circuit 220 applies a symbol by symbol scaling to each symbol in detected output 211 and provides the scaled values as a scaled output 221, and passes detected output 211 through without scaling as scaled output 221 on a symbol by symbol basis where defect indicator 271 is not asserted. In either case, this selective scaling operates to modify soft data associated with the effected symbols or bits to reduce the probability that the symbol is considered properly found. By doing this, the likelihood that an effected symbol or bit negatively impacts processing of the data set is reduced and the likelihood that the symbol will be modified by later processing is increased. Selective scaling circuit 220 provides scaled output 221 to a data decoder circuit 230. For the purposes of this document, a symbol may be either a non-binary symbol or a binary symbol depending upon the particular implementation.

Data decoder circuit 230 applies a data decode algorithm to scaled output 221 to yield a decoded output that includes soft decoded output 232. In some embodiments of the present invention, data decoder circuit 230 is a low density parity check decoder circuit as are known in the art. Where the decoded output converges (i.e., yields the original data set as indicated by the lack of remaining errors), it is provided as a data output 231.

Figure 3:
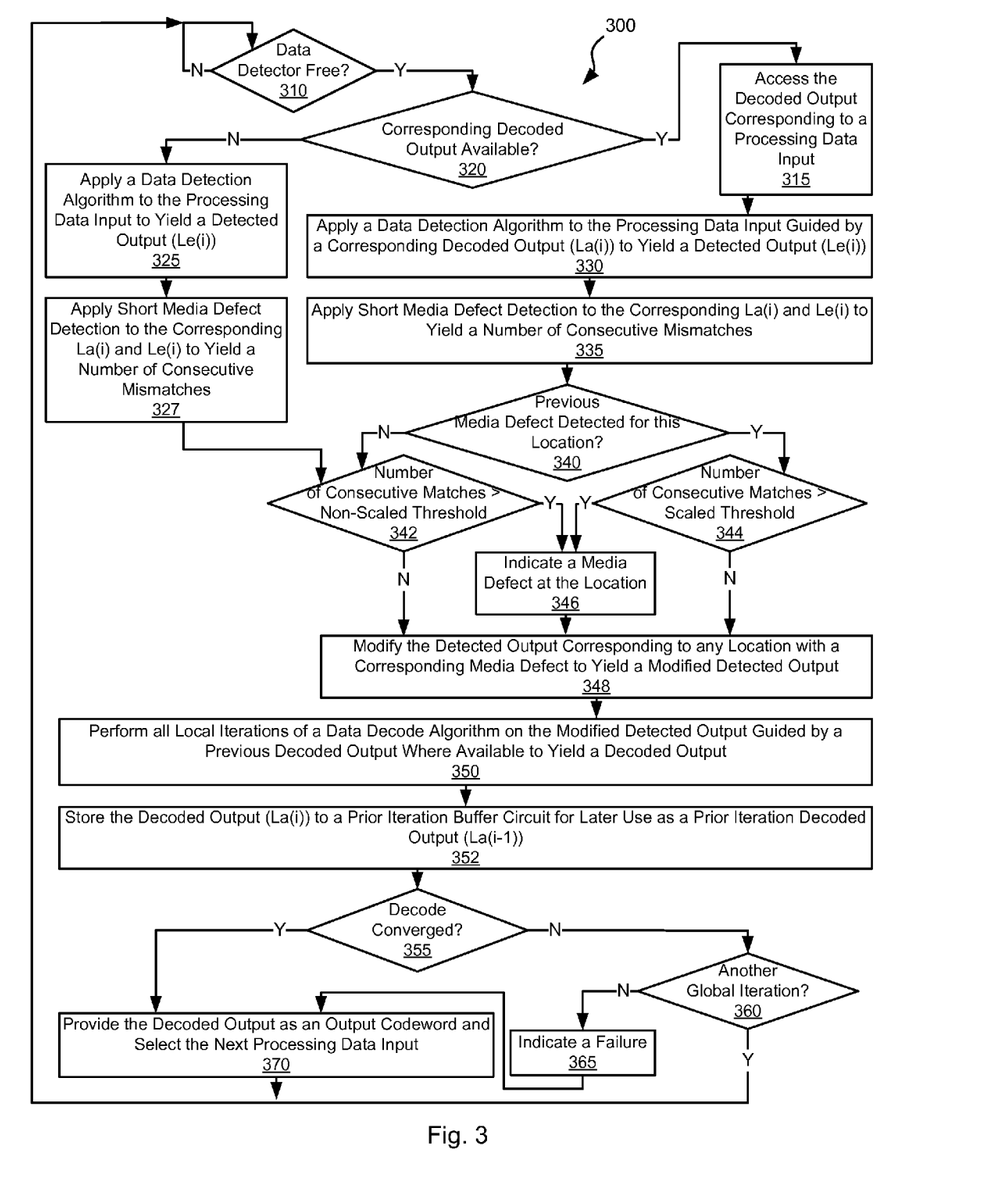
FIG. 3 is a flow diagram showing a method in accordance with some embodiments of the present invention for data processing including feedback based short media defect detection threshold modification.

Turning to FIG. 3, a flow diagram 300 shows a method in accordance with some embodiments of the present invention for data processing including feedback based short media defect detection threshold modification. Following flow diagram 300, it is determined whether a data detector circuit is available to process a newly received data set or a data set that has already been subject to one or more prior global iterations (block 310). Where a data detector circuit is available (block 310), a processing data input is accessed and it is determined whether a decoded output corresponding to the accessed processing data input exists (block 320). Such a decoded output is available as a result from a preceding global iteration applied to the same processing data input. The processing data input may be, for example, derived from a storage medium. Where a corresponding decoded output is not available (block 320), a data detection algorithm is applied to the processing data input to yield a detected output (block 325). The data detection algorithm may be, but is not limited to, a Viterbi data detection algorithm or a maximum a posteriori data detection algorithm as are known in the art. Based upon the disclosure provided herein, one of ordinary skill in the art will recognize a variety of data detection algorithms that may be used in relation to different embodiments of the present invention. A short media detect detection is applied to the corresponding detected output (Le(i)) and decoded output (La(i)) to yield a defect value (i) (block 327). In some embodiments of the present invention, the defect value (i) is a number of consecutive, preceding instances of mismatches between corresponding instances of the detected output and the decoded output.

It is then determined whether the detected value (i) exceeds a non-scaled threshold value (block 342). In some embodiments of the present invention, the non-scaled threshold value is user programmable, while in other embodiments it is fixed. Where the detected value (i) exceeds a non-scaled threshold value (block 342), a media defect is indicated at the location corresponding to instance i (bock 346). Otherwise, where the detected value (i) does not exceed the non-scaled threshold value (block 342), no defect is indicated.

Alternatively, where a corresponding decoded output (La(i)) is available (block 320), it is accessed (block 315) and a data detection algorithm is applied to the processing data input guided by the corresponding decoded output (La(i)) to yield a detected output (Le(i)) (block 330). Such a corresponding decoded output is available for the second or later global iterations (i.e., i>=1) for a given processing data input. The short media detect detection is applied to the corresponding detected output (Le(i)) and decoded output (La(i)) to yield a defect value (i) (block 335). Again, in some embodiments of the present invention, the defect value (i) is a number of consecutive, preceding instances of mismatches between corresponding instances of the detected output and the decoded output.

It is then determined whether the previous global iteration processing the currently processing data set indicated a media defect at the location corresponding to instance i (block 340). Where a defect was indicated in the preceding global iteration (block 340), it is determined whether the defect value (i) exceeds a scaled threshold value (block 344). The scaled threshold value may be derived, for example, by multiplying the non-scaled threshold value by a scalar value greater than unity (i.e., scalar value >1). In other cases, the scaled threshold value may be user programmable, or a pre-defined fixed value. Where the detected value (i) exceeds the scaled threshold value (block 344), a media defect is indicated at the location corresponding to instance i (bock 346). Otherwise, where the detected value (i) does not exceed the scaled threshold value (block 344), no defect is indicated.

Otherwise, where a defect was not indicated in the preceding global iteration (block 340), it is then determined whether the detected value (i) exceeds the non-scaled threshold value (block 342). Where the detected value (i) exceeds the non-scaled threshold value (block 342), a media defect is indicated at the location corresponding to instance i (bock 346). Otherwise, where the detected value (i) does not exceed the non-scaled threshold value (block 342), no defect is indicated.

In any case, the detected output is modified at locations corresponding an indicated media defect to yield a modified detected output (block 348). This modification may include, but is not limited to, multiplying instances of the detected output corresponding to an indicated media defect by a scaling value less than unity (i.e., scaling factor <1). By doing this, the likelihood that an effected symbol negatively impacts processing of the data set is reduced and the likelihood that the symbol will be modified by later processing is increased. Otherwise, where no defect is indicated, the detected output is left unmodified. As another example, this modification may include replacing the instance of the detected output corresponding to the indicated media defect by a scaled version of the corresponding instance of the decoded output.

All local iterations of a data decode algorithm are then applied to the detected output guided by a previous decoded output where available (block 350). This process generates an updated decoded output that may be used during subsequent global iterations where it does not converge (i.e., have no remaining unsatisfied checks). In some embodiments of the present invention, the data decode algorithm is a low density parity check algorithm as is known in the art. The decoded output (La(i)) is stored to the prior iteration buffer circuit for later use as a prior iteration decoded output (La(i−1)) (block 352).

It is determined whether the data decode algorithm converged (block 355). Where the data decode algorithm converged (block 355), the decoded output is provided as an output codeword, and the next processing data input is selected for processing (block 370). Alternatively, where the data decode algorithm failed to converge (block 355), it is determined whether another global iteration is allowed (block 360). Where another global iteration is not allowed (block 360), a failure is indicated (block 361) and the decoded output is provided as an output codeword, and the next processing data input is selected for processing (block 370). In contrast, where another global iteration is allowed (block 360), a subsequent location iteration is applied to the same processing data input guided by the results of the preceding global iteration.

Figure 4:
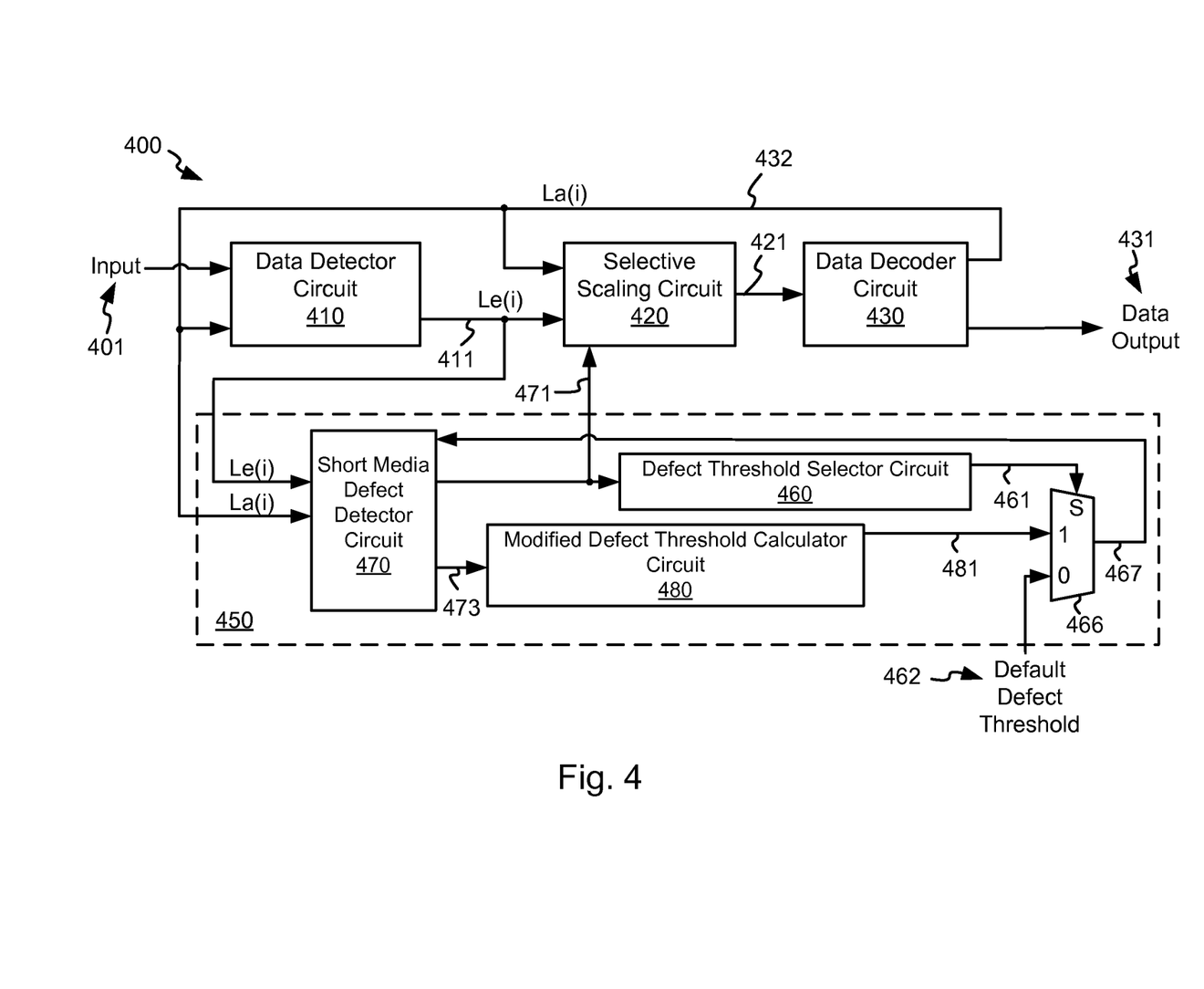
FIG. 4 shows another data processing circuit including a feedback based short media defect detection threshold modification circuit in accordance with various embodiments of the present invention.

Turning to FIG. 4, a data processing circuit 400 including a feedback based short media defect detection threshold modification circuit 450 is shown in accordance with various embodiments of the present invention. Feedback based short media defect detection threshold modification circuit 450 includes a short media defect detector circuit 470, a defect threshold selector circuit 460, a modified defect threshold calculator circuit 480, and a multiplexer circuit 466. Data processing circuit 400 includes a data detector circuit 410 that applies a data detection algorithm to a data input 401 guided by a soft decoded output 432. Soft decoded output 432 is denoted La(i), where 'i' represents the iteration number. In particular, 'i' indicates data derived from the most recent iteration, and 'i−1' indicates data derived from a preceding iteration.

In some embodiments of the present invention, data input 401 is derived from a storage medium. Based upon the disclosure provided herein, one of ordinary skill in the art will recognize a variety of sources for data input 401. Data detector circuit 410 may be, but is not limited to, a maximum a posteriori data detector circuit, or a Viterbi algorithm data detector circuit. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Application of the data detection algorithm by data detector circuit 410 yields a detected output 411. Detected output 411 is denoted Le(i), where 'i' represents the iteration number. In particular, 'i' indicates data derived from the most recent iteration, and 'i−1' indicates data derived from a preceding iteration. An iteration denoted by 'i' is a global iteration which is defined as processing a data set through both data detector circuit 410 and a data decoder circuit 430.

Detected output 411 and soft decoded output 432 are provided to both a selective scaling circuit 420, and short media defect detector circuit 470 that performs a short media defect detection. Short media defect detector circuit 470 may be any circuit operable to generate a defect value (i) based upon a combination of detected output 411 and soft decoded output 432, where the defect value (i) corresponds to a likelihood of a media defect on a storage medium from which data input 401 is derived. Short media defect detector circuit 470 compares the generated defect value (i) with a defect threshold 467. Where the generated defect value (i) is greater than defect threshold 467, a defect indicator 471 is asserted. Otherwise, defect indicator 471 is not asserted. In some embodiments of the present invention, the defect value (i) is a number of consecutive, preceding instances of detected output 411 and soft decoded output 432 that do not match. In one particular embodiment of the present invention, short media defect detector circuit 470 may be implemented similar to that disclosed in U.S. Pat. No. 8,201,051 entitled "Method for Detecting Short Burst Errors in LDPC System", issued Jun. 12, 2012 to Tan et al. The entirety of the aforementioned reference is incorporated herein by reference for all purposes.

Defect threshold 467 is adjusted based upon whether defect indicator 471 was asserted to indicate a defect was found during a preceding global iteration processing the corresponding instance i. In particular, defect indicator 471 is provided to defect threshold selector circuit 460. Where defect indicator 271 is asserted indicating the occurrence of a defect at the location corresponding to the index i for the preceding global iteration, defect threshold selector circuit 460 asserts a selector output 461 to multiplexer circuit 466 such that a modified threshold value (i) 481 is selected as defect threshold 467. Modified defect threshold calculator circuit 480 averages the defect values 473 generated by short media defect detector circuit 470 for a preceding number of instances i. In one particular embodiment of the present invention, the preceding number of instances is twelve (12) (i.e., defect values (i–11 to i)). Based upon the disclosure provided herein, one of ordinary skill in the art will recognize other numbers of preceding instances that may be used in relation different embodiments of the present invention. This averaged value is provided as modified threshold value (i) 481 to multiplexer circuit 466.

Otherwise, where defect indicator 471 is de-asserted indicating the no occurrence of a defect at the location corresponding to the index i for the preceding global iteration, a default defect threshold 462 is selected by multiplexer circuit 466 as defect threshold 467. In some embodiments of the present invention, default defect threshold 462 is programmable. In other embodiments of the present invention, default defect threshold 462 is fixed.

The following pseudocode represents the operation of feedback based short media defect detection threshold modification circuit 450:

```
If(global iterations == 0) { //first global iteration
        for (i= to end of data set){ // for each instance in the processing data set
                apply short media defect detection algorithm to yield a defect value (i);
                If (defect value (i) > default defect threshold){
                        defect indicator (i) for the global iteration = asserted
                }
                Else {
                        defect indicator (i) for the global iteration =de- asserted
                }
                If (i > 10){ // make modified threshold value as the average of the last 12
                        temp value = 0; //initialize temp value
                        for (n=0 to 11){
                                temp value = defect value (i–n)
                        }
                        modified threshold value (i) = temp value/12
                }
        }
}
Else If (global iterations > 0) {
        for (i= 0 to end of data set){ // for each instance in the processing data set
                apply short media defect detection algorithm to yield a defect value (i);
                If (defect indicator (i) = = asserted for the prior global iteration){
                        If (defect value (i) > modified threshold value){
                                defect indicator (i) for the global iteration = asserted
                        }
                        Else {
                                defect indicator (i) for the global iteration = de-asserted
                        }
                Else If (defect indicator (i) == de-asserted for the prior global iteration){
                        If (defect value (i) > default defect threshold){
                                defect indicator (i) for the global iteration = asserted
                        }
                        Else {
                                defect indicator (i) for the global iteration = de-asserted
                        }
                }
                If (i > 10){ // make modified threshold value as the average of the last 12
                        temp value = 0; //initialize temp value
                        for (n=0 to 11){
                                temp value = defect value (i–n)
                        }
                        modified threshold value (i) = temp value/12
                }
        }
}
```

Defect indicator 471 is provided to a selective scaling circuit 420. Selective scaling circuit 420 delays detected output 411 to align it with defect indicator 471. Where defect indicator 471 is asserted, selective scaling circuit 420 applies a symbol by symbol scaling to each symbol in soft decoded output 432 that corresponds to defect indicator 471 and provides the scaled values as a scaled output 421, and passes detected output 411 through without scaling as scaled output 421 on a symbol by symbol basis where defect indicator 471 is not asserted. In another embodiment of the present invention, where defect indicator 471 is asserted, selective scaling circuit 420 applies a symbol by symbol scaling to each symbol in detected output 411 and provides the scaled values as a scaled output 421, and passes detected output 411 through without scaling as scaled output 421 on a symbol by symbol basis where defect indicator 471 is not asserted. In either case, this selective scaling operates to modify soft data associated with the effected symbols or bits to reduce the probability that the symbol is considered properly found. By doing this, the likelihood that an effected symbol or bit negatively impacts processing of the data set is reduced and the likelihood that the symbol will be modified by later processing is increased. Selective scaling circuit 420 provides scaled output 421 to a data decoder circuit 430. For the purposes of this document, a symbol may be either a non-binary symbol or a binary symbol depending upon the particular implementation.

Data decoder circuit 430 applies a data decode algorithm to scaled output 421 to yield a decoded output that includes soft decoded output 432. In some embodiments of the present invention, data decoder circuit 430 is a low density parity check decoder circuit as are known in the art. Where the decoded output converges (i.e., yields the original data set as indicated by the lack of remaining errors), it is provided as a data output 431.

Figure 5:
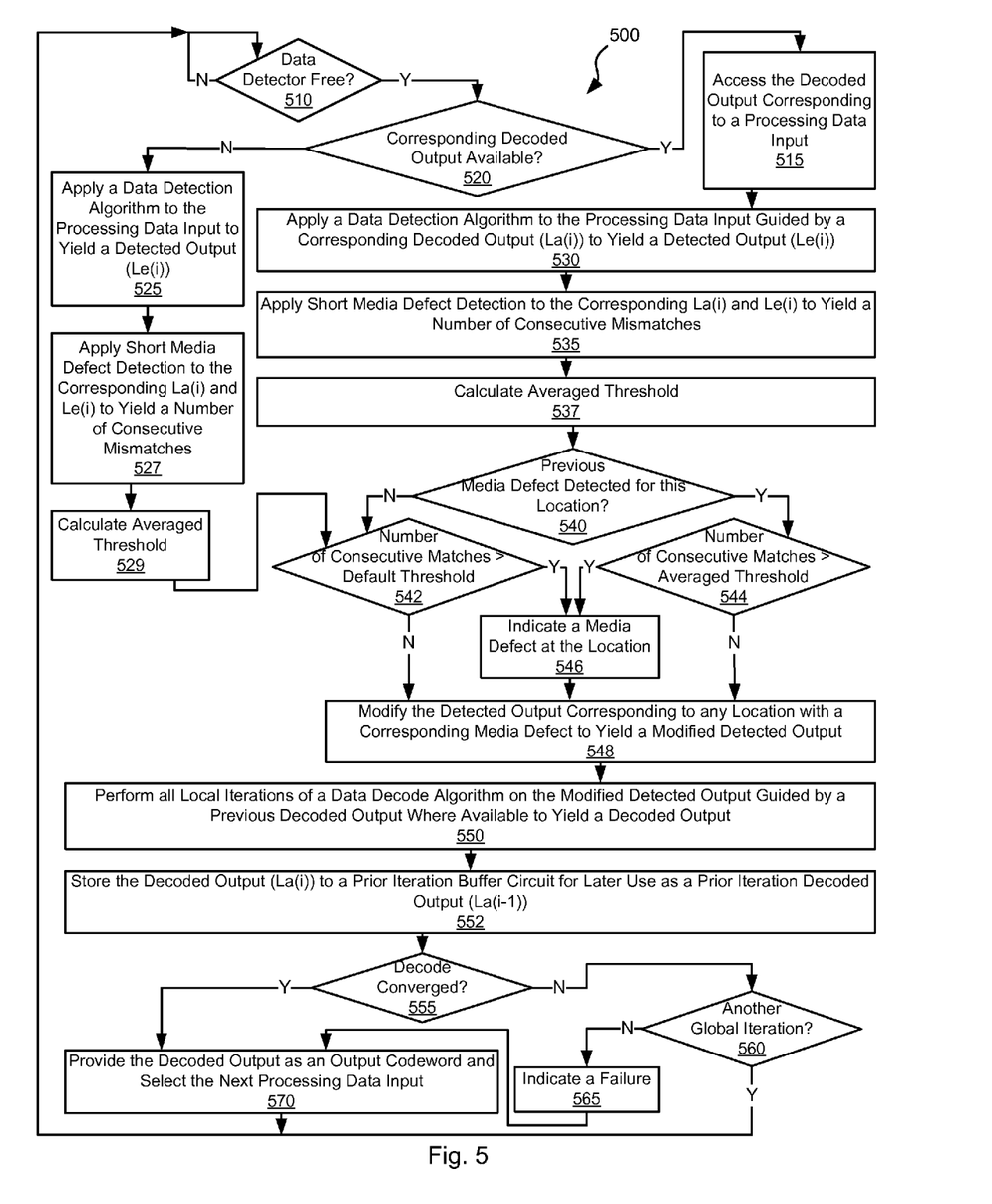
FIG. 5 is a flow diagram showing a method in accordance with other embodiments of the present invention for data processing including feedback based short media defect detection threshold modification.

Turning to FIG. 5, a flow diagram 500 shows a method in accordance with some embodiments of the present invention for data processing including feedback based short media defect detection threshold modification. Following flow diagram 500, it is determined whether a data detector circuit is available to process a newly received data set or a data set that has already been subject to one or more prior global iterations (block 510). Where a data detector circuit is available (block 510), a processing data input is accessed and it is determined whether a decoded output corresponding to the accessed processing data input exists (block 520). Such a decoded output is available as a result from a preceding global iteration applied to the same processing data input. The processing data input may be, for example, derived from a storage medium. Where a corresponding decoded output is not available (block 520), a data detection algorithm is applied to the processing data input to yield a detected output (block 525). The data detection algorithm may be, but is not limited to, a Viterbi data detection algorithm or a maximum a posteriori data detection algorithm as are known in the art. Based upon the disclosure provided herein, one of ordinary skill in the art will recognize a variety of data detection algorithms that may be used in relation to different embodiments of the present invention. A short media detect detection is applied to the corresponding detected output (Le(i)) and decoded output (La(i)) to yield a defect value (i) (block 527). In some embodiments of the present invention, the defect value (i) is a number of consecutive, preceding instances of mismatches between corresponding instances of the detected output and the decoded output.

An averaged threshold value is calculated (block 529). The averaged threshold value is calculated by averaging a defined number of preceding instances of the defect value (i) generated in block 527. In one particular embodiment of the present invention, the defined number is twelve. Based upon the disclosure provided herein, one of ordinary skill in the art will recognize a variety of numbers that may be used in relation to different embodiments of the present invention.

It is then determined whether the detected value (i) exceeds a default threshold value (block 542). In some embodiments of the present invention, the default threshold value is user programmable, while in other embodiments it is fixed. Where the detected value (i) exceeds the default threshold value (block 542), a media defect is indicated at the location corresponding to instance i (bock 546). Otherwise, where the detected value (i) does not exceed the default threshold value (block 542), no defect is indicated.

Alternatively, where a corresponding decoded output (La(i)) is available (block 520), it is accessed (block 515) and a data detection algorithm is applied to the processing data input guided by the corresponding decoded output (La(i)) to yield a detected output (Le(i)) (block 530). Such a corresponding decoded output is available for the second or later global iterations (i.e., i>=1) for a given processing data input. The short media detect detection is applied to the corresponding detected output (Le(i)) and decoded output (La(i)) to yield a defect value (i) (block 535). Again, in some embodiments of the present invention, the defect value (i) is a number of consecutive, preceding instances of mismatches between corresponding instances of the detected output and the decoded output.

An averaged threshold value is calculated (block 537). The averaged threshold value is calculated by averaging a defined number of preceding instances of the defect value (i) generated in block 535. In one particular embodiment of the present invention, the defined number is twelve. Based upon the disclosure provided herein, one of ordinary skill in the art will recognize a variety of numbers that may be used in relation to different embodiments of the present invention.

It is then determined whether the previous global iteration processing the currently processing data set indicated a media defect at the location corresponding to instance i (block 540). Where a defect was indicated in the preceding global iteration (block 540), it is determined whether the defect value (i) exceeds the averaged threshold value calculated during the preceding global iteration (block 544). Where the detected value (i) for the current global iteration exceeds the averaged threshold value calculated during the preceding global iteration (block 544), a media defect is indicated at the location corresponding to instance i (bock 546). Otherwise, where the detected value (i) does not exceed averaged threshold value (block 544), no defect is indicated.

Otherwise, where a defect was not indicated in the preceding global iteration (block 540), it is then determined whether the detected value (i) exceeds the default threshold value (block 542). Where the detected value (i) exceeds the default threshold value (block 542), a media defect is indicated at the location corresponding to instance i (bock 546). Otherwise, where the detected value (i) does not exceed the default threshold value (block 542), no defect is indicated.

In any case, the detected output is modified at locations corresponding an indicated media defect to yield a modified detected output (block 548). This modification may include, but is not limited to, multiplying instances of the detected output corresponding to an indicated media defect by a scaling value less than unity (i.e., scaling factor <1). By doing this, the likelihood that an effected symbol negatively impacts processing of the data set is reduced and the likelihood that the symbol will be modified by later processing is increased. Otherwise, where no defect is indicated, the detected output is left unmodified. As another example, this modification may include replacing the instance of the detected output corresponding to the indicated media defect by a scaled version of the corresponding instance of the decoded output.

All local iterations of a data decode algorithm are then applied to the detected output guided by a previous decoded output where available (block 550). This process generates an updated decoded output that may be used during subsequent global iterations where it does not converge (i.e., have no remaining unsatisfied checks). In some embodiments of the present invention, the data decode algorithm is a low density parity check algorithm as is known in the art. The decoded output (La(i)) is stored to the prior iteration buffer circuit for later use as a prior iteration decoded output (La(i−1)) (block 552).

It is determined whether the data decode algorithm converged (block 555). Where the data decode algorithm converged (block 555), the decoded output is provided as an output codeword, and the next processing data input is selected for processing (block 570). Alternatively, where the data decode algorithm failed to converge (block 555), it is determined whether another global iteration is allowed (block 560). Where another global iteration is not allowed (block 560), a failure is indicated (block 561) and the decoded output is provided as an output codeword, and the next processing data input is selected for processing (block 570). In contrast, where another global iteration is allowed (block 560), a subsequent location iteration is applied to the same processing data input guided by the results of the preceding global iteration.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for performing defect detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscriber line systems. Therefore, the above description should not be taken as limiting the scope of the invention, which is defined by the appended claims.

What is claimed is:

1. A data processing system, the data processing system comprising:
    a data detector circuit operable to apply a data detection algorithm to a detector input to yield a first detected output, and to apply the data detection algorithm to the detector input to yield a second detected output;
    a data decoder circuit operable to apply a data decoding algorithm to a first decoder input derived from the first detected output to yield a first decoded output, and to apply the data decoding algorithm to a second decoder input derived from the second detected output to yield a second decoded output;
    a media defect detector circuit including at least a first input coupled to the data detector circuit and operable to receive the first detected output and a second input coupled to the data decoder circuit and operable to receive the first decoded output, and wherein the media defect detector circuit is operable to generate a defect value based on a combination of the first detected output and the first decoded output, and to compare the defect value with a first defect threshold to yield a defect indicator for a region of a medium from which the detector input is derived for the first global iteration; and
    a threshold selection circuit operable to select a second defect threshold based at least in part on the defect indicator indicating a media defect for the first global iteration.

2. The data processing system of claim 1, wherein the second defect threshold is selected to be the first defect threshold.

3. The data processing system of claim 1, wherein the second defect threshold is selected to be the first defect threshold multiplied by a scalar value when the defect indicator indicates a media defect for the first global iteration; and wherein the scalar value is greater than unity.

4. The data processing system of claim 3, wherein the scalar value is programmable.

5. The data processing system of claim 1, wherein the defect value is a number of mismatches between the first detected output and the first decoded output within a first range of an instant location, and wherein the second defect threshold is selected from a group consisting of: the first defect threshold, and a number of mismatches between the first detected output and the first decoded output within a second range of the instant location.

6. The data processing system of claim 5, wherein the number of mismatches between the first detected output and the first decoded output within a second range of the instant location is selected as the second defect threshold when the defect indicator indicates a media defect for the first global iteration.

7. The data processing system of claim 1, wherein the defect indicator is a first defect indicator, wherein the defect value is a first defect value, wherein the media defect detector circuit is further operable to generate a second defect value based on a combination of the second detected output and the second decoded output, and to compare the second defect value with the second defect threshold to yield a second defect indicator for a region of a medium from which the detector input is derived for the second global iteration.

8. The data processing system of claim 1, wherein the system is implemented as an integrated circuit.

9. The data processing system of claim 1, wherein the system is implemented as part of a storage device.

10. The data processing system of claim 9, wherein the medium is a magnetic storage medium.

11. The data processing system of claim 1, wherein the data decoder circuit is a low density parity check decoder circuit.

12. The data processing system of claim 1, wherein the data detector circuit is selected from a group consisting of: a Viterbi algorithm data detector circuit, and a maximum a posteriori data detector circuit.

13. A method for media defect detection, the method comprising:

applying a data detection algorithm to a detector input by a data detector circuit to yield a first detected output;

applying a data decoding algorithm by a data decoder circuit to a first decoder input derived from the first detected output to yield a first decoded output;

providing a media defect detector circuit including at least a first input coupled to the data detector circuit and operable to receive the first detected output and a second input coupled to the data decoder circuit and operable to receive the first decoded output;

applying a media defect detection algorithm by the media defect detector circuit to a combination of the first detected output and the first decoded output to yield a defect value;

comparing the defect value with a first defect threshold to yield a defect indicator for a region of a medium from which the detector input is derived for a first global iteration;

applying the data detection algorithm to the detector input to yield a second detected output;

applying the data decoding algorithm to a second decoder input derived from the second detected output to yield a second decoded output; and selecting a second a second defect threshold based at least in part on the defect indicator indicating a media defect for the first global iteration.

14. The method of claim 13, wherein the second defect threshold is selected to be the first defect threshold multiplied by a scalar value when the defect indicator indicates a media defect for the first global iteration, and wherein the scalar value is greater than unity.

15. The method of claim 14, wherein the method further comprises:

programming the scalar value.

16. The method of claim 13, wherein the second defect threshold is selected to be the first defect threshold when the defect indicator indicates a no media defect for the first global iteration.

17. The method of claim 13, wherein the defect value is a number of mismatches between the first detected output and the first decoded output within a first range of an instant location, and wherein the second defect threshold is selected from a group consisting of: the first defect threshold, and a number of mismatches between the first detected output and the first decoded output within a second range of the instant location.

18. The method of claim 17, wherein the number of mismatches between the first detected output and the first decoded output within a second range of the instant location is selected as the second defect threshold when the defect indicator indicates a media defect for the first global iteration.

19. The method of claim 13, wherein the defect indicator is a first defect indicator, wherein the defect value is a first defect value, wherein the method further comprises:

generating a second defect value based on a combination of the second detected output and the second decoded output; and comparing the second defect value with the second defect threshold to yield a second defect indicator for a region of a medium from which the detector input is derived for the second global iteration.

20. A data processing system, the data processing system comprising:

a means for applying a data detection algorithm to a detector input to yield a first detected output, and applying the data detection algorithm to the detector input to yield a second detected output;

a means for applying a data decoding algorithm to a first decoder input derived from the first detected output to yield a first decoded output, and applying the data decoding algorithm to a second decoder input derived from the second detected output to yield a second decoded output;

a means for detecting a media defect including at least a first input coupled to the means for applying a data detection algorithm that receives the first detected output and a second input coupled to the means for applying a data decoding algorithm that receives the first decoded output, the means for detecting a media defect generating a defect value based on a combination of the first detected output and the first decoded output, and comparing the defect value with a first defect threshold to yield a defect indicator for a region of a medium from which the detector input is derived for the first global iteration; and a means for detecting a threshold that selects a second defect threshold based at least in part on the defect indicator indicating a media defect for the first global iteration.

* * * * *